United States Patent
Pickering et al.

(10) Patent No.: US 7,298,194 B2
(45) Date of Patent: Nov. 20, 2007

(54) INTERPOLATION

(75) Inventors: Andrew Pickering, Hillmorton (GB); Susan Simpson, Buckingham (GB); Peter Hunt, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 128 days.

(21) Appl. No.: 11/151,335

(22) Filed: Jun. 13, 2005

(65) Prior Publication Data

US 2007/0001741 A1  Jan. 4, 2007

(30) Foreign Application Priority Data

Jun. 12, 2004 (GB) ................. 0413149.6

(51) Int. Cl.
  *H03K 11/16* (2006.01)
(52) U.S. Cl. .............. 327/231; 327/235; 327/237; 327/355; 327/357
(58) Field of Classification Search .............. None
  See application file for complete search history.

(56) References Cited

U.S. PATENT DOCUMENTS

| | | | | |
|---|---|---|---|---|
| 5,708,383 A * | 1/1998 | Lee | ............ | 327/356 |
| 5,945,860 A * | 8/1999 | Guay et al. | .............. | 327/246 |
| 6,107,848 A | 8/2000 | Pickering et al. | ......... | 327/146 |
| 6,466,098 B2 * | 10/2002 | Pickering | ............ | 331/25 |
| 6,940,352 B2 * | 9/2005 | Bhattacharjee et al. | ..... | 330/254 |
| 6,943,606 B2 * | 9/2005 | Dunning et al. | ............ | 327/231 |
| 2003/0183842 A1 | 10/2003 | Kizer et al. | .............. | 257/158 |
| 2006/0055430 A1 * | 3/2006 | Pickering et al. | .............. | 327/2 |

FOREIGN PATENT DOCUMENTS

EP  1 10-4 110 A2  5/2001

* cited by examiner

*Primary Examiner*—Kenneth B. Wells
*Assistant Examiner*—An T. Luu
(74) *Attorney, Agent, or Firm*—William B Kempler; W. James Brady, III; Frederick J. Telecky, Jr.

(57) ABSTRACT

A steering current generator for a phase interpolator has a multiplicity of fine phase adjustment current sources, each of which is switchable to direct its current to one or other of two summing nodes. The current of each of those two summing nodes is supplemented by respective fixed always-on current sources. The steering current generator has four current outputs and a switching matrix is provided to switch the current from the summing nodes to first and second selected ones of those outputs. The switching matrix is also connected to switch bleed currents to the other two of the current outputs.

7 Claims, 2 Drawing Sheets

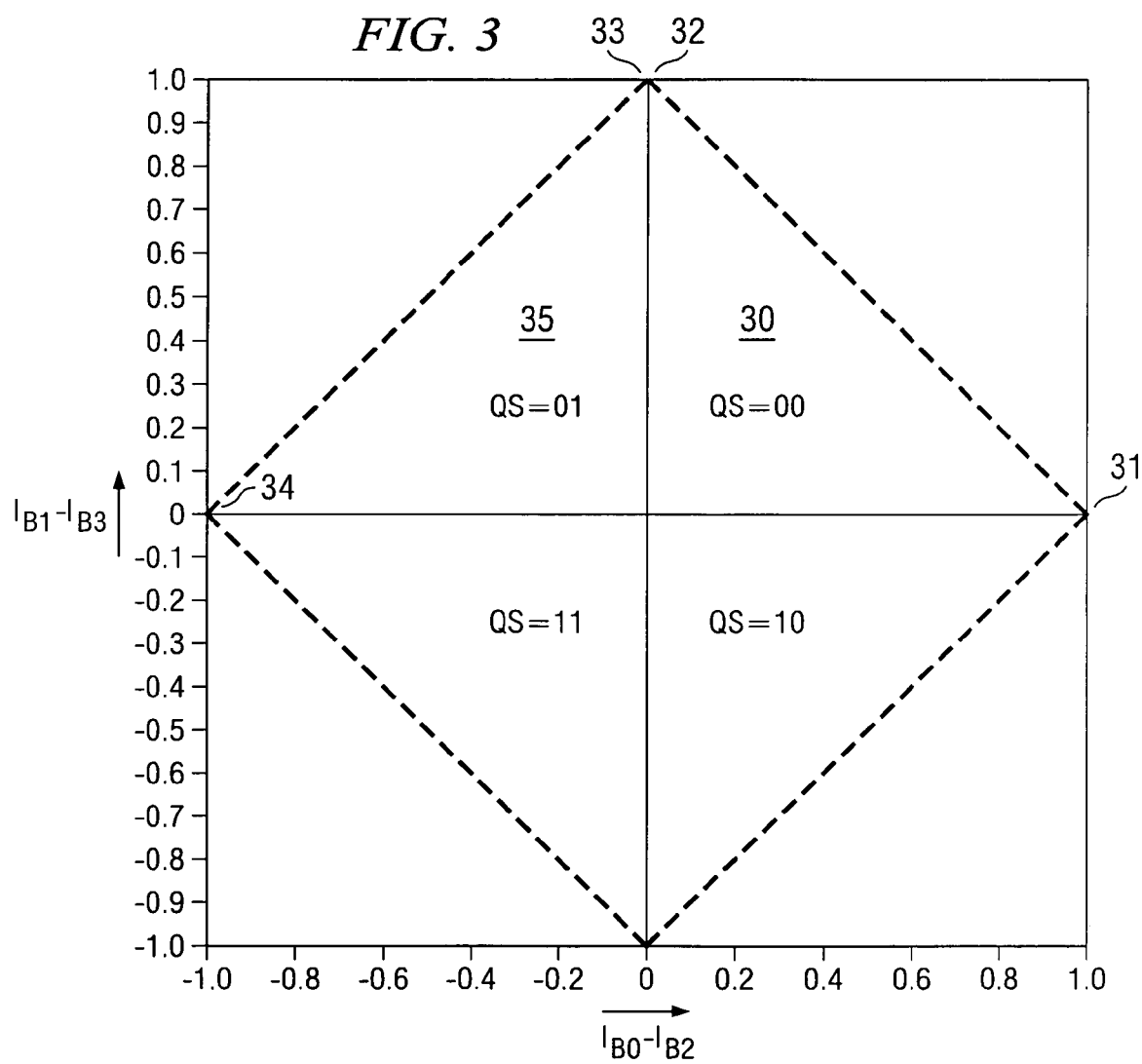

INTERPOLATION

BACKGROUND OF THE INVENTION

This invention relates to interpolation and more particularly to an interpolator structure suitable for fabrication as part of an integrated circuit. The invention relates more particularly still to the generation of steering currents required to move the operating point of the interpolator are around the phase circle.

SUMMARY OF THE INVENTION

The present invention provides a steering current generator as defined in the appended claims.

BRIEF DESCRIPTION OF THE DRAWINGS

There will now be described an example of the invention, with reference to the accompanying drawings, of which:

FIG. 3 is diagram plotting the outputs of the current generator.

DETAILED DESCRIPTION

Figure 1:
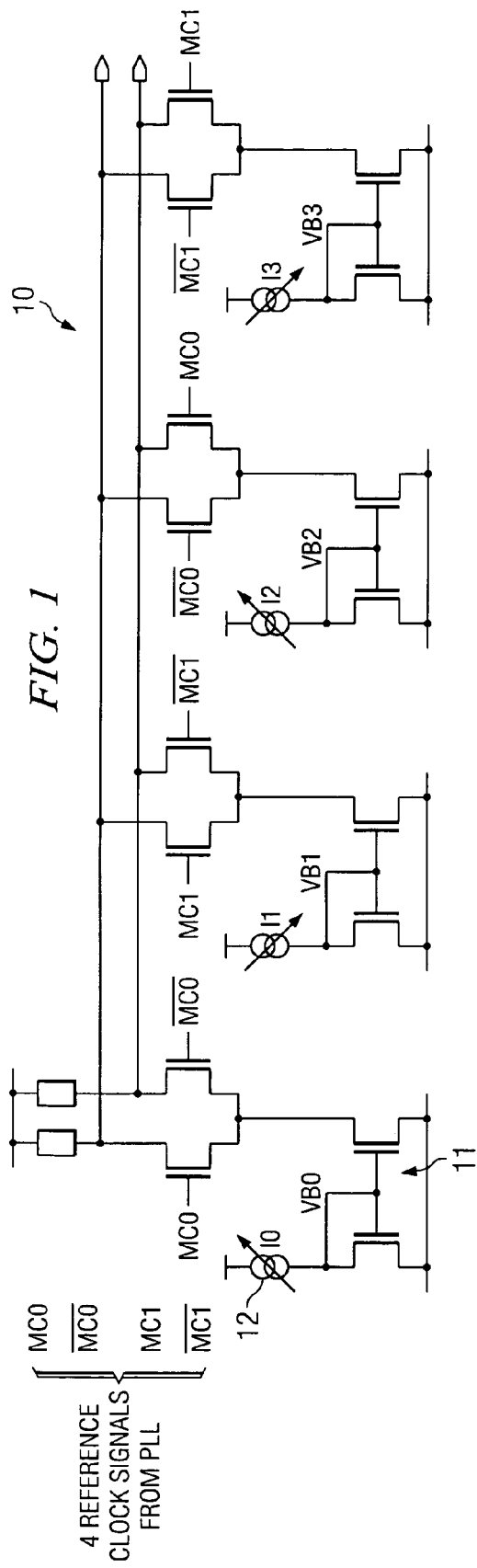
FIG. 1 is a circuit diagram of a phase interpolator.

A schematic of the structure of an interpolator is shown in FIG. 1. For more details of the operation and function of such a circuit the reader is referred to the applicant's co-pending application filed on even date under the designation TI-38552, U.S. application Ser. No. 11/150,902, which is incorporated herein by reference.

It will be observed that the interpolator has a four stage structure and that each stage is biased by a current mirror, such as current mirror 11. The presence of the current mirror enables the stage to be controlled by a steering currents $I_0$, $I_1$, $I_2$, $I_3$ and the generation of such a steering current will now be considered in more detail.

Figure 2:
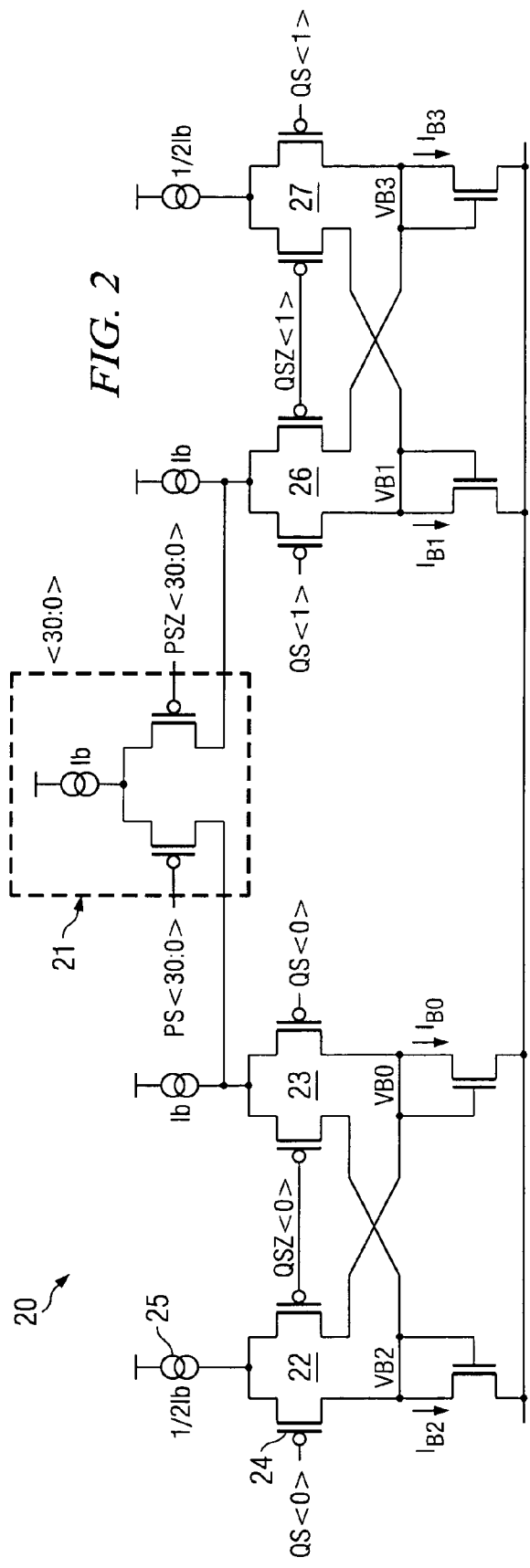
FIG. 2 is a steering current generator according to the invention.

A steering current generator 20 is shown in FIG. 2. The required resultant current is generated by summing a number of currents generated and controlled within the circuit. Sub-circuit 21 may for example be controlled by differential inputs PS and PSZ to sum current into the summing node of switching circuit stages B0 and B1 respectively (i.e. stages 23 and 26). In an exemplary embodiment of the current steering control arrangement, there are 31 instances of circuit block 21, receiving 31 separate single bit inputs such that each of the transistors within the instances of the circuit maybe individually controlled to supply current to either stage B0, B1 in accordance with the single bit inputs. Note that since the PS<i> is the inverse of PSZ<i> the total current provided to the stages B0 and B1 is a constant, namely 31 times Ib.

Referring now to FIG. 3, assume that the interpolator is operating at operating point 31, equivalent to a PS input of 0; i.e. 31 bits each with a value of 0. The operating point may be stepped by gradually increasing the number of bits set and eventually the operating point reaches 32, where all 31 bits have the logic value of 1.

Thus far, the operating point of the interpolator has been restricted to a first quadrant of operation 30. The operating quadrant is defined by a two bit code (QS), which in the first quadrant 30 has the value 00. In that quadrant the control signals QS cause the current summed from the circuit blocks 21 to form currents $I_{B0}$ and $I_{B1}$. Those currents also comprise an additional unit of Ib. provided by a current source 28, 29 respective to each of the stages 23 and 26. These currents $I_{B0}$ and $I_{B1}$ are mirrored into the interpolator of FIG. 1 as mentioned above.

In the circuit implementation (FIG. 2) the QS inputs, also control further the stages of the circuit, such as stages 22 and 27 (stages B2 and B3) and are input to one of two coupled transistors in each stage, such as input 24.

In quadrant 00 stages B2 and B3 do not receive any current from the circuit blocks 21 but only units of ½ Ib. from respective current sources, which currents respectively form currents $I_{B2}$ and $I_{B3}$, which are mirrored into other stages of the interpolator.

Stages B2 and B0 are cross coupled together, and stages B1 and B3 likewise. Each of the stages are fed from a different leg of the single bit driven circuits, 21. (B2 and B0 from one leg and B1 and B3 from the other.) Moving the operating point to the first point of the second quadrant 35 is achieved by altering the QS Code from the value 00 to the value 01. This switches the current from circuit blocks 21 from contributing to $I_{B0}$ to contributing to $I_{B2}$, and $I_{B0}$ becomes ½ Ib. It is not necessary to alter the individual bit codes applied to the circuit blocks 21.

The operating point may then be stepped through the second quadrant, 35 by stepwise reduction of the number of set bits applied to the circuits 21, eventually reaching operating point 34, which corresponds to the all zeros input condition.

In FIG. 3, the operating point of the current generator is illustrated by the current summation of $(I_{B0}-I_{B2})$ as the x-axis and $(I_{B1}-I_{B3})$ as the y-axis. In the circuit of FIG. 1, however, of course, $I_{B0}$ $I_{B1}$, $I_{B2}$, $I_{B3}$ control the four stages individually and respectively, but the angular position of the spots in the diagram about the origin nonetheless also represent the phase of the signal output by the interpolator.

A number of advantages of the circuit has thus far described will be apparent.

Firstly, the circuit is fully differential.

The quadrant selection code is intrinsically, Gray-coded, it and since the single bit values for operating points, which our neighbours across the reference phase boundaries such as points 32 and 33 are the same, by virtue of the Gray-code only a single bit change in the entire circuit is required to cross the reference phase boundary, for example from the first sector quadrant 30 the second quadrant 35. It will be appreciated that the entire phase wheel, may be transitioned by changing a single bit at a time.

It will be noted that the bleed current applied to stage 22 is in magnitude of one half different to that applied to circuit portion 23. In this way, when the circuit switches quadrants, a full step value is achieved by switching from for example −½ Ib. to +½ Ib. By virtue of this arrangement the output of the interpolator is never derived from a single reference phase. This has the important consequence that the current in any of the stages is never reduced to zero.

In particular embodiments, it may be found that other bleed current combinations are advantageous for example, 7½ for circuit 22 and 8 for circuit 23.

Note also that the architecture of the interpolator of FIG. 1 allows other numbers of reference phases and respective circuit stages therefor, from a minimum of three. Versions of the steering current generator comprise two summing nodes and sector switches that direct the currents from the circuit blocks 21 to the two active circuit stages of the circuit of FIG. 1. ("Sector" has been used since there may be a number of "quadrants" unequal to four.) Bleed currents (e.g. ½ Ib.) are switched to the remaining circuit stages.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A steering current generator for a phase interpolator, comprising:
   a plurality of steering current outputs,
   first and second summing nodes,
   a plurality of current source blocks, each having two output legs respectively connected to one of the summing nodes, having a first control input and being responsive to the first control input to switch an output current to one or other of the legs,
   first and second switching circuit stages, each having a current input respectively connected to one of the summing nodes and a second control input, and each being connected so that in response to the second control input they switch the currents from their respective summing nodes to different ones of the steering current outputs wherein the first switching circuit stage is connected to switch the current from the first summing node to either a first or a second one of the current steering outputs and the second switching circuit stage is connected to switch the current from the first summing node to either a third or a fourth one of the current steering outputs, the third and fourth ones being different from the first and second ones.

2. A steering current generator according to claim 1 comprising a bleed current source and a third switching stage connected to receive the current from the bleed current source and switch it to a steering current output that is not receiving a current from a summing node.

3. A steering current generator according to claim 2 comprising a second bleed current source and a fourth switching stage connected to receive the current from the second bleed current source and switch it to a steering current output that is not receiving a current from a summing node.

4. A steering current generator according to claim 1 comprising first and second bleed current sources and third and fourth switching stages connected to receive respectively current from the first and second bleed current sources and to switch them to ones of the steering current outputs that is not connected to receive current from a summing node.

5. A steering current generator according to claim 4 wherein the first bleed current generator is connected to switch its current to either the first or second steering current output and the second bleed current generator is connected to switch its current to either the third or fourth steering current output.

6. A steering current generator according to claim 1 comprising first and second additional current sources connected to supply a fixed unswitched current to the first and second summing nodes respectively.

7. A steering current generator according to claim 1 wherein the number of steering current outputs is exactly four.

* * * * *